United States Patent [19]
Su et al.

[11] Patent Number: 5,955,914
[45] Date of Patent: Sep. 21, 1999

[54] VOLTAGE REGULATOR FOR A VOLTAGE PUMP IN A DRAM

[75] Inventors: Hua-Yu Su, Milpitas; Lik T. Cheng, San Jose, both of Calif.

[73] Assignee: Integrated Silicon Solution, Inc., Santa Clara, Calif.

[21] Appl. No.: 09/047,908

[22] Filed: Mar. 25, 1998

[51] Int. Cl.$^6$ .................................................. G05F 1/10
[52] U.S. Cl. .................................................. 327/536; 363/60
[58] Field of Search ..................................... 327/536, 537, 327/365; 307/110; 365/226, 227, 228; 363/60

[56] References Cited

U.S. PATENT DOCUMENTS

| | | | |
|---|---|---|---|
| 4,673,829 | 6/1987 | Gupta | 327/537 |
| 5,692,843 | 12/1997 | Furuya | 400/120.02 |
| 5,729,172 | 3/1998 | Tsukada | 327/536 |
| 5,747,974 | 5/1998 | Jeon | 323/269 |
| 5,811,990 | 9/1998 | Blodgett et al. | 326/81 |
| 5,831,470 | 11/1998 | Park et al. | 327/536 |

*Primary Examiner*—Kenneth B. Wells
*Assistant Examiner*—Maria Hasanzadah
*Attorney, Agent, or Firm*—Pennie & Edmonds LLP

[57] ABSTRACT

The Vpp generator for use in a dynamic random access memory has a pump circuit and a voltage regulator. The voltage regulator controls the pump circuit such that the pumped up voltage has a maximum predetermined value. The prior art Vpp regulator sets the pumped up voltage, Vpp, to approximately a supply voltage, Vcc, plus the threshold voltage of a memory cell access transistor. This level becomes very high when the supply voltage, Vcc, is high and may overstress the devices. The present invention regulates the pumped up voltage, Vpp, at a substantially constant voltage level for high supply voltages. This level is safe and will not cause overstress.

14 Claims, 13 Drawing Sheets

Vclamp: A predefined voltage
Vccr: The output of the Vccr Generator,
Vccr=Vcc, while Vcc<Vclamp
Vccr=Vclamp, while Vcc>Vclamp 5,955,914

VOLTAGE REGULATOR FOR A VOLTAGE PUMP IN A DRAM

The present invention relates generally to a regulator for a voltage pump for a dynamic random access memory (DRAM) integrated circuit and, more particularly, to a voltage pump regulator for preventing overstress of the DRAM when operating at high supply voltages.

BACKGROUND OF THE INVENTION

A dynamic random access memory (DRAM) is a semiconductor device for storing digital information. Data, as digital information, can be written to and read from a DRAM. DRAMS are fabricated using integrated circuit technology and are powered by a supply voltage called Vcc.

FIG. 1 is a schematic of a DRAM memory cell 100. A DRAM has many memory cells. Typically, each memory cell comprises a combination of a cell access transistor 101 and a capacitor C 103. The cell access transistor 101 is generally an n-channel transistor having a slightly higher threshold voltage than a regular n-channel transistor. In the memory cell, digital information is represented by a charge stored in the capacitor C 103. However, the capacitor C 103 will lose its charge unless it is regularly recharged or refreshed. When a memory cell stores a "one" value, the capacitor is charged, and when the memory cell stores a "zero" value, the capacitor is discharged. In addition, reading the information stored in the memory cell 100 destroys the contents of the memory cell. After reading the memory cell 100, the memory cell contents need to be restored. Each memory cell 100 connects to a word-line (WL) 105 and a bit-line 107. To fully restore a "one" level to the memory cell capacitor C 103, the word line driver typically outputs a voltage on the word line 105 that exceeds the voltage applied to the bit-line 107, the supply voltage Vcc, by at least the amount of the threshold voltage Vth of cell access transistor 101 so that the capacitor C 103 can be charged up to the same voltage level as the bit-line. Therefore, DRAMs need an internal high voltage generator, commonly called Vpp generator, to generate or "pump" up the supply voltage Vcc to a required voltage level called Vpp.

FIG. 2 is a general block diagram of a Vpp generator 200 to supply a pumped-up Vpp voltage. The Vpp generator 200 has a pump circuit 210 and a Vpp regulator 220 which are connected in series. The pump circuit 210 comprises an oscillator 230 and a pump driver 240. The pump circuit 210 outputs a pumped-up voltage called Vpp, and Vpp is fed back to the Vpp regulator 220. The Vpp regulator 220 outputs an enable signal to the oscillator 230. If Vpp is below a required voltage level, the enable signal output by the Vpp regulator 220 is "on." When the enable signal is "on," the oscillator 230 continues to run and the pump driver 240 increases the voltage Vpp. When Vpp reaches the required voltage level, the Vpp regulator 220 turns the enable signal to "off." When the enable signal is off, the oscillator 230 stops running and the pump driver 240 no longer increases the voltage Vpp.

FIG. 3 is a schematic diagram of the prior art Vpp regulator 220 of FIG. 2. The circuit comprises a memory cell access transistor M3, two n-channel transistors M4, M5, two p-channel transistors M1, M2, and an inverter I1. In this and the following schematics, the following conventions are used. The memory cell access transistor, e.g., M3, is drawn with a "c" between the source and the drain. A "•" inside the transistor is placed closest to the transistor's source. A p-channel transistor has an "o" on its gate, while an n-channel transistor has no "o." If a substrate wire is not shown, for an n-channel transistor the substrate connects to ground, and for a p-channel transistor, the substrate connects to Vcc. The numbers beneath the reference character near the transistor indicate the transistor's preferred width and length. For example, memory cell access transistor M3 has a width of 0.6 microns and a length of 0.35 microns.

To accurately regulate the pumped-up voltage Vpp, this individual memory cell access transistor M3 has characteristics which match the memory cell access transistors in the whole memory array. The threshold voltage of transistor M3 matches the threshold voltage of the memory cell access transistors, Vth (cell).

Referring also to FIG. 4a, a graph shows the result of a simulation of the prior art Vpp regulator circuit of FIG. 3 when Vcc equal to 3.3 volts. When Vpp<Vcc+Vth(cell), memory cell access transistor M3 is turned off. Since M3 is turned off, the voltage at node N1 follows Vpp and increases. The source to gate voltage of M2 is less than the threshold voltage of p-channel transistor M2. Therefore, M2 is off. Since the voltage at the gate of n-channel transistor M4 is Vcc, M4 is turned on. Therefore, node N2 is at ground, a low state, and the inverter I1 outputs an enable signal at Vcc, a high state, to turn on the oscillator.

As voltage Vpp approaches Vcc+Vth(cell), memory cell access transistor M3 begins to turn on. The voltage at node N1 stops increasing. As Vpp further increases, the source to gate voltage of M1 and M2 eventually exceeds the threshold voltage of the p-channel transistors M1 and M2. M1 and M2 turn on. The voltage at node N2 begins to increase. When node N2 reaches the voltage level that the inverter I1 recognizes as "high," the enable signal output by inverter I1 becomes "low" and turns off the oscillator. Therefore, in the prior art, Vpp is always regulated at to a voltage approximately equal to Vcc+Vth(cell).

In summary, the enable signal shuts off the pump circuit (not shown) when the exact voltage required to fully turn on the memory cell access device is attained. In other words, when Vpp rises sufficiently to turn on n-channel transistor M3 to allow current to flow, the enable signal becomes 'LOW' to shut off the pump circuit (not shown).

FIG. 4b is a graph of the result of a simulation of the prior art Vpp regulator circuit of FIG. 3 for various supply voltages. The x-axis is Vpp and the y-axis is the enable signal voltage. The enable signal voltage is shown for five different supply voltages Vcc's: 2.3 V, 2.8 V, 3.3 V, 3.8 V and 4.3 V. Typically, the supply voltage is about 3.3 volts for normal operation. For each level of Vcc shown, the pumped-up voltage Vpp exceeds the supply voltage Vcc by approximately 2 V. Therefore, in the prior art, the Vpp regulator sets the Vpp level at about the supply voltage plus the threshold voltage of the memory access transistor, approximately Vcc+Vth(cell).

The prior art Vpp regulator sets Vpp to approximately Vcc+Vth(cell). This level becomes very high when the supply voltage Vcc is high. It may stress the devices severely and cause reliability problems. For example, at supply voltages Vcc of 3.8 V and 4.3 V, Vpp becomes 6 V and 6.6 V, respectively, which may cause the overstress and shorten the lifetime of the DRAM. Therefore, there is a need for a method and apparatus to clamp the pumped-up voltage Vpp to a safe operating level for a range of high supply voltages Vcc to prevent overstress of DRAMs.

SUMMARY OF THE INVENTION

A Vpp generator for use in a dynamic random access memory has a pump circuit and a voltage regulator. The voltage regulator controls the pump circuit such that the pumped up voltage, Vpp, has a maximum predetermined value. The prior art Vpp regulator sets Vpp to approximately the supply voltage, Vcc, plus the threshold voltage of a memory cell access transistor, Vth(cell). This level becomes very high when the supply voltage, Vcc, is high and may overstress the devices. The present invention regulates the pumped up voltage Vpp at a substantially constant voltage level for high supply voltages. This level is safe and will not cause overstress.

The voltage generator generates a regulated Vcc, called Vccr. When the supply voltage is less than a predefined voltage, called Vclamp, Vccr is equal to Vcc. When the supply voltage exceeds Vclamp, Vccr is regulated at Vclamp. The invention applies Vccr to the prior art Vpp regulator such that when the supply voltage is less than Vclamp, Vpp is set to Vcc+Vth(cell). However, when the supply voltage exceeds Vclamp, Vpp is constantly set to a voltage substantially equal to Vclamp+Vth(cell).

These and other features and advantages of the present invention will become more apparent from the following detailed description of exemplary embodiments thereof which are illustrated in the accompanying drawings.

BRIEF DESCRIPTION OF THE DRAWINGS

FIG. 6b shows an embodiment of the voltage multiplier of FIG. 5a.

DESCRIPTION OF THE PREFERRED EMBODIMENTS

Figure 5:
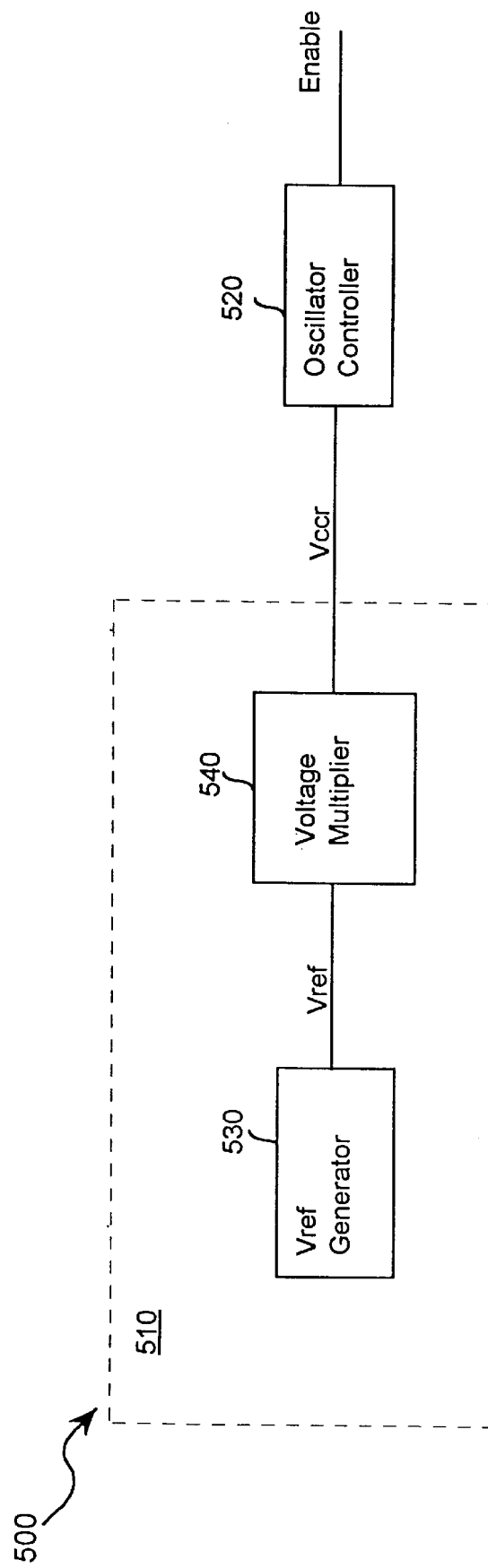
FIG. 5 is a block diagram of the Vpp regulator of the preferred embodiment of the present invention.

FIG. 5 shows the Vpp regulator 500 of the preferred embodiment of the present invention. The Vpp regulator 500 of the present invention has a Vccr generator 510 coupled to an oscillator controller 520 which is coupled to an oscillator (not shown). The oscillator is well known to those skilled in the art. The Vccr generator 510 outputs a voltage Vccr and includes a reference voltage generator (Vref generator) 530 which connects to a voltage multiplier 540.

Figure 6A:
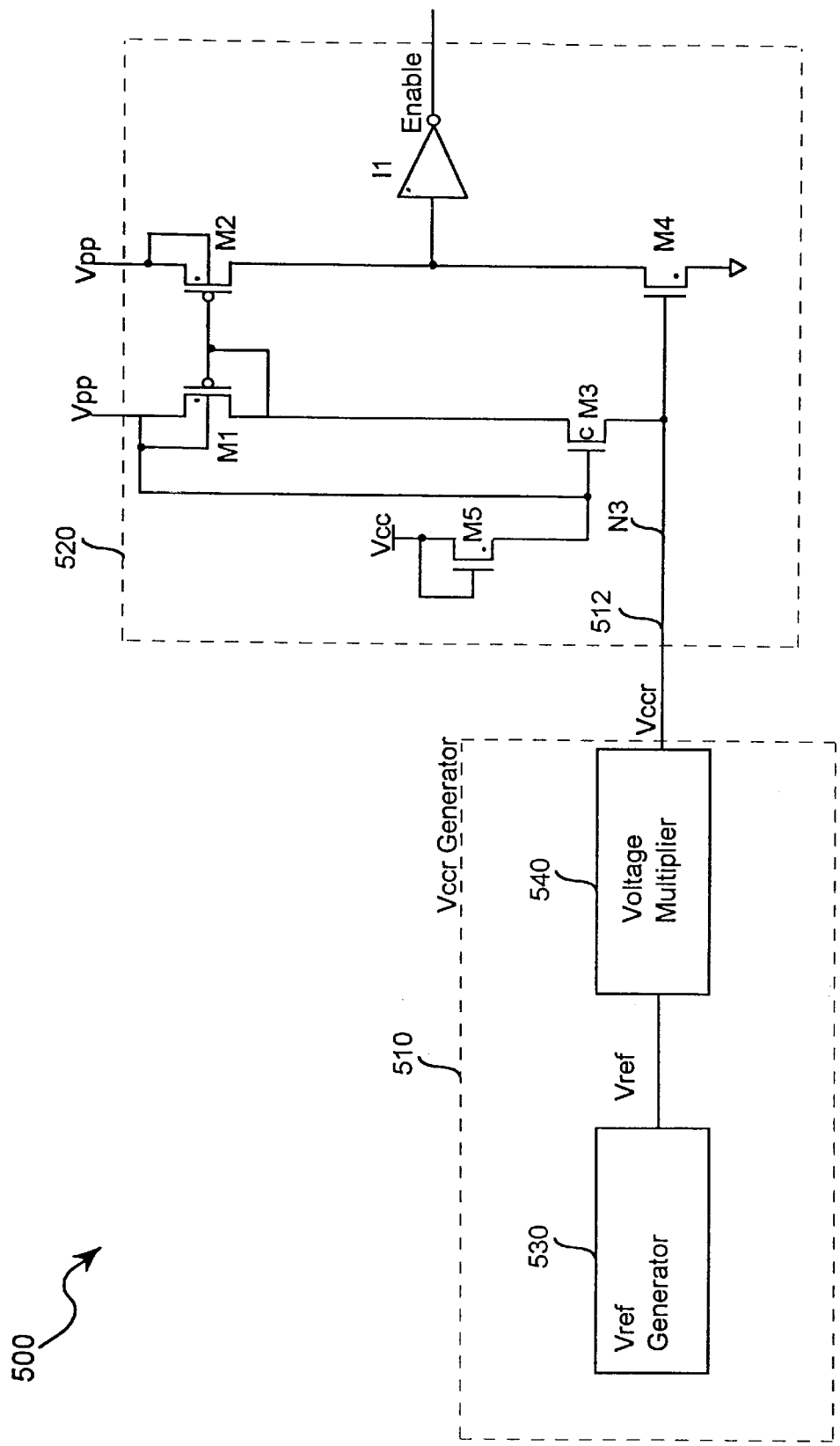
FIG. 6a is schematic diagram of the oscillator controller of FIG. 5.

FIG. 6a is a schematic diagram of the oscillator controller of FIG. 5. In this description, common reference characters will be used to refer to similar components. The oscillator controller 520 uses the same components as the prior art Vpp regulator 220 of FIG. 3. However, in the present invention, the source of the memory cell access transistor M3 and the gate of n-channel transistor M4 connect to the Vccr voltage line 512. In contrast, in the prior art shown in FIG. 3, the source of the memory cell transistor M3 and the gate of n-channel transistor M4 connect to Vcc. By replacing Vcc with a regulated Vcc, i.e., Vccr, memory cell access transistor M3 can be made to turn on at a different and lower voltage than in the prior art device.

The Vref generator 530 generates a reference voltage called Vref. The reference voltage is independent of supply voltage levels. That is, for a very wide range of supply voltage levels Vcc, Vref remains at substantially the same value.

The Vref generator 530 is coupled to the voltage multiplier 540 and to the oscillator controller 520. The voltage multiplier 540 has the reference voltage Vref as an input, and outputs a regulated voltage called Vccr.

Figure 6C:
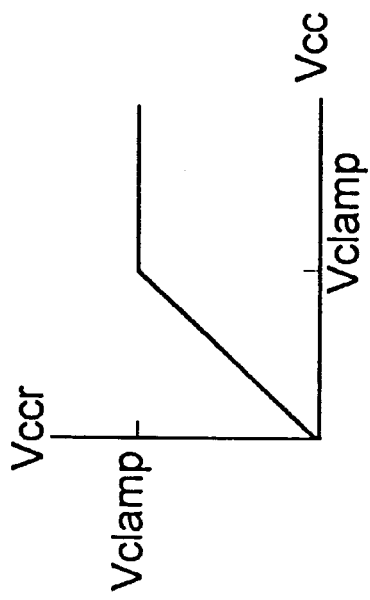
FIG. 6c is a graph showing the relationship between Vcc and Vccr in the Vpp regulator of FIG. 5.
Figure 6B:
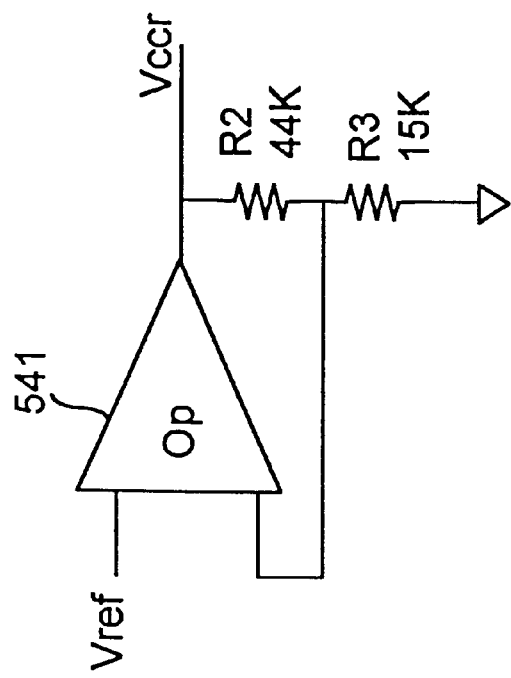

FIG. 6b shows an embodiment of the voltage multiplier 540 of FIG. 5. The voltage multiplier 540 can be implemented by using an operational amplifier 541. Vref is input to the operational amplifier 541 and Vccr is output. Resistors R2 and R3 are connected in series between Vccr and ground. Vccr is fed back to the other input of the operational amplifier 541 through resistor R2. Resistor R3 connects to ground. The clamped voltage level Vclamp can be estimated as follows:

$$Vclamp \approx Vref \times (R2+R3)/R3$$

FIG. 6c is a graph showing the relationship between Vcc and Vccr in the voltage multiplier 540 of FIG. 5. The voltage multiplier 540 operates as follows:

When Vcc<Vclamp, then Vccr=Vcc.

When Vcc>Vclamp, then Vccr=Vclamp.

When the supply voltage Vcc is less than Vclamp, Vccr has a linear relationship to Vcc. When the supply voltage Vcc exceeds Vclamp, Vccr is clamped to a substantially constant level equal to Vclamp.

The Vpp regulator 500 of the present invention acts like a clamp circuit to clamp Vpp to a predetermined level. The clamped level of Vpp is substantially equal to the voltage Vccr plus the threshold voltage of the memory cell access transistor M3, Vccr+Vth(cell). Therefore, Vpp has the following characteristics:

When Vcc<Vclamp, then Vpp=Vccr+Vth(cell)=Vcc+Vth(cell).

When Vcc>Vclamp, then Vpp=Vccr+Vth(cell)=Vclamp+Vth(cell).

When operating at higher ranges of the supply voltage, that is, Vcc>Vclamp, when Vpp reaches the Vclamp+Vth (cell) level, the enable signal is "off," i.e., low. As a result, Vpp is clamped at Vclamp+Vth(cell), which is a safe voltage level and DRAM overstress is prevented.

Figure 7A:
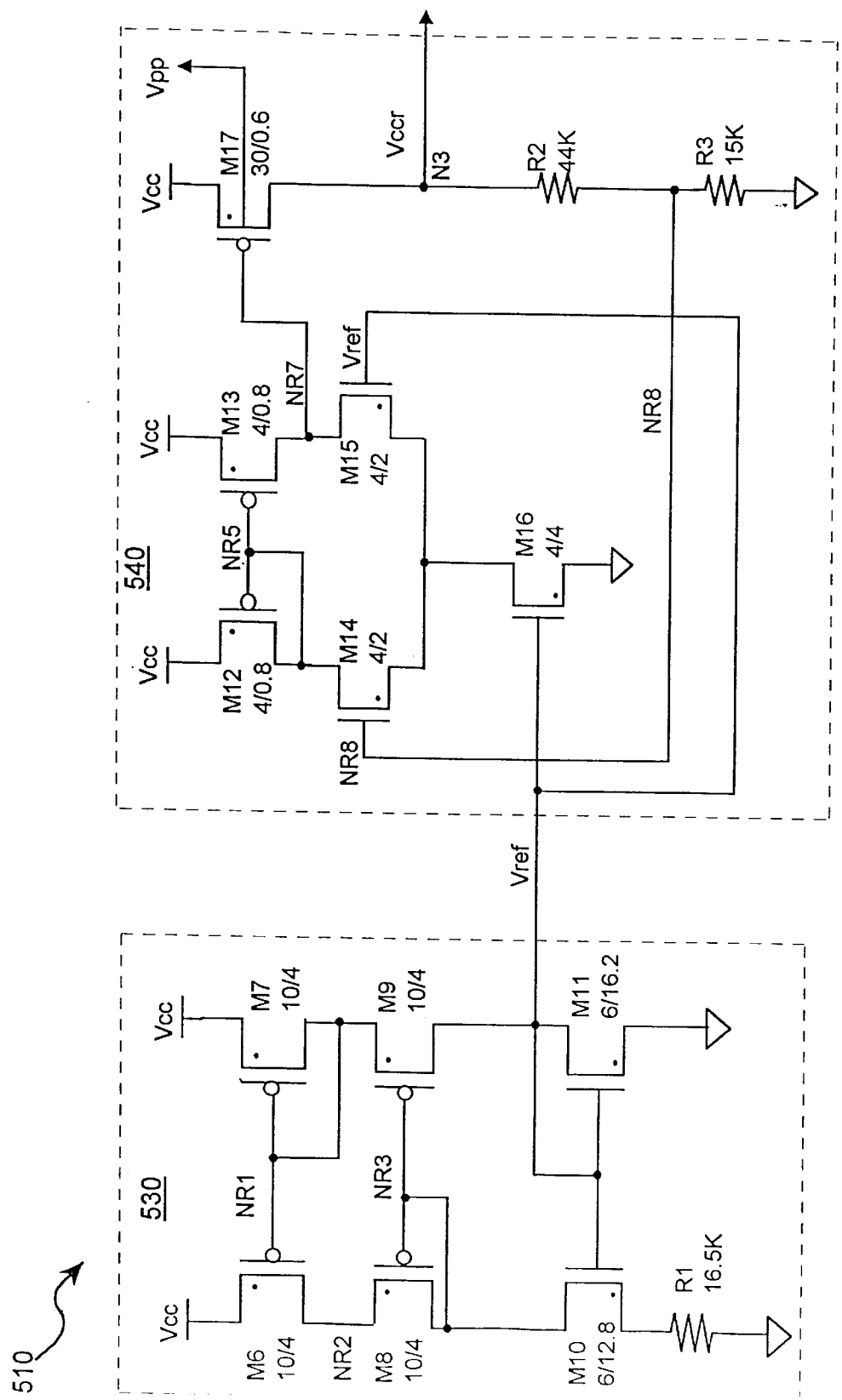
FIG. 7a is a detailed schematic diagram of the preferred embodiment of the Vccr generator of FIG. 5 showing the geometry of each transistor.

FIG. 7a is a schematic diagram of a Vpp regulator circuit of the preferred embodiment of the present invention. The Vref generator 530, the voltage multiplier 540 and the oscillator controller 520 are well-known circuits. In the present invention, the oscillator controller 520 was described above and is a modified version of the prior art voltage regulator of FIG. 3. Those skilled in the art will recognize that other circuits may be used to implement the Vref generator 530, the voltage multiplier 540 and the oscillator controller 520. The present embodiment is not meant to be limited to a particular circuit. FIG. 7a shows the preferred geometry for the transistors in the present invention.

The Vref generator 530 comprises n-channel transistors M10 and M11, p-channel transistors M6–M9, and resistor R1 with a value of 16.5K ohms. For a wide range of supply voltages Vcc, the reference voltage Vref remains substantially constant. For Vcc levels ranging from about 2.5 V to about 4.3 V, Vref will be approximately 0.85 V.

Voltage multiplier 540 comprises n-channel transistors M14–M16, p-channel transistors M12, M13 and M17, and resistors R2 and R3, having values of 44K ohms and 15K ohms respectively. Transistors M12–M17 form an operational amplifier. Vref is input to the gate of n-channel transistor M16 which acts as a current source for the operational amplifier. The drain of M16 connects to the sources of M14 and M15. One input of the operational amplifier, the gate of M15, is connected to the reference voltage Vref. The output of the operational amplifier is Vccr. Vccr is fed back to the other input of the operational amplifier via the ratio circuit R2 and R3. The voltage across R3 is virtually the same as Vref. According to voltage division, Vref is equal to:

$$Vref=Vccr \times R3/(R2+R3),$$

and $$Vccr=Vref \times (R2+R3)/R3.$$

The clamped voltage is equal to:

$$Vclamp=Vref \times (R2+R3)/R3=0.85\ V \times (44K+15K)/15K \approx 3.34\ V.$$

Figure 7B:
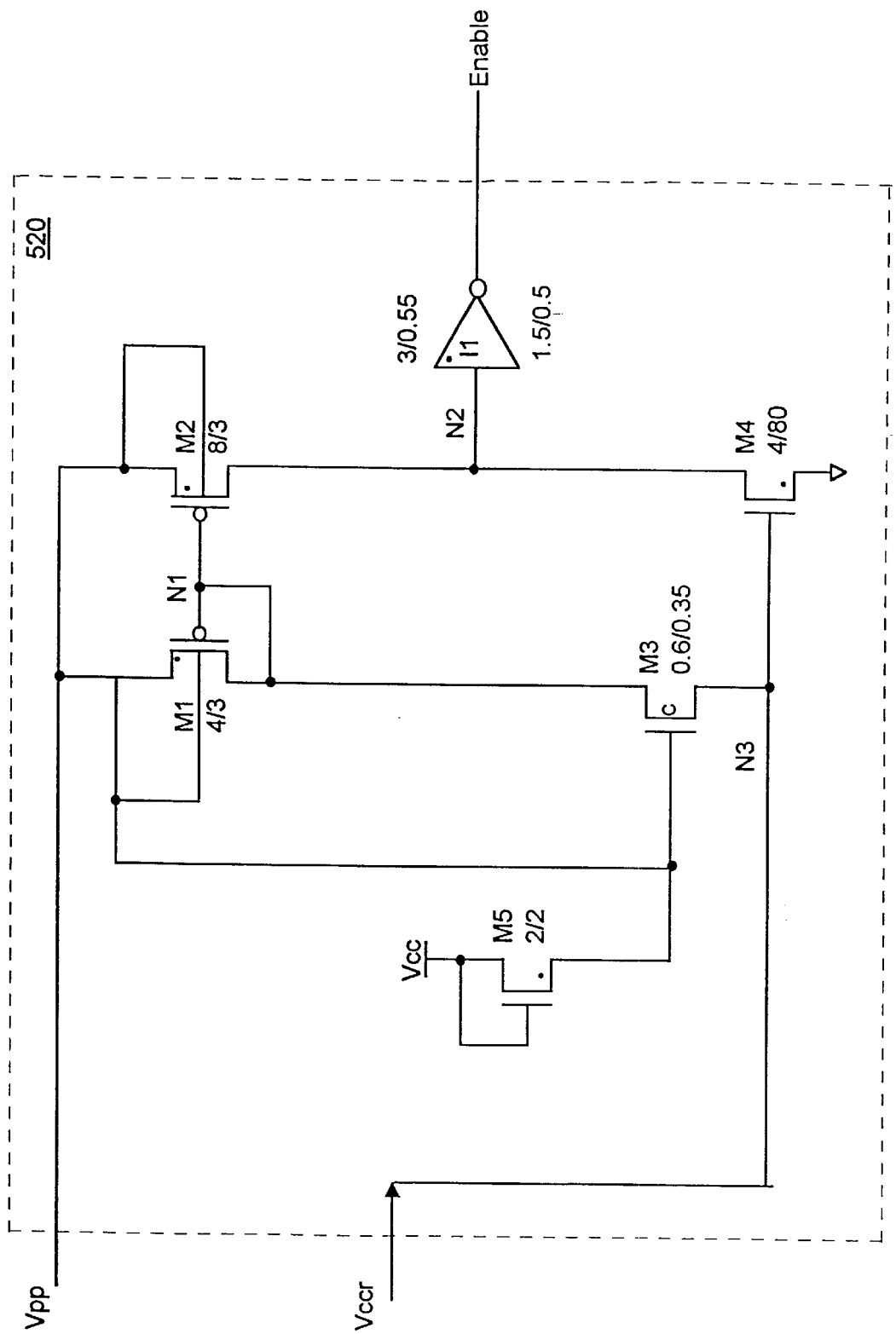
FIG. 7b is a detailed schematic diagram of the oscillator controller of FIG. 5 showing the geometry of each transistor.

Referring to FIG. 7b, the oscillator controller operates in a manner similar to the prior art. If Vpp is less than Vccr+Vth(cell), M2 and M3 turn off, N2 goes low and the enable signal goes high to turn on the oscillator. If Vpp is greater than Vccr+Vth(cell), then M2 and M3 turn on, N2 goes high and the enable signal goes low to turn off the oscillator.

Figure 8:
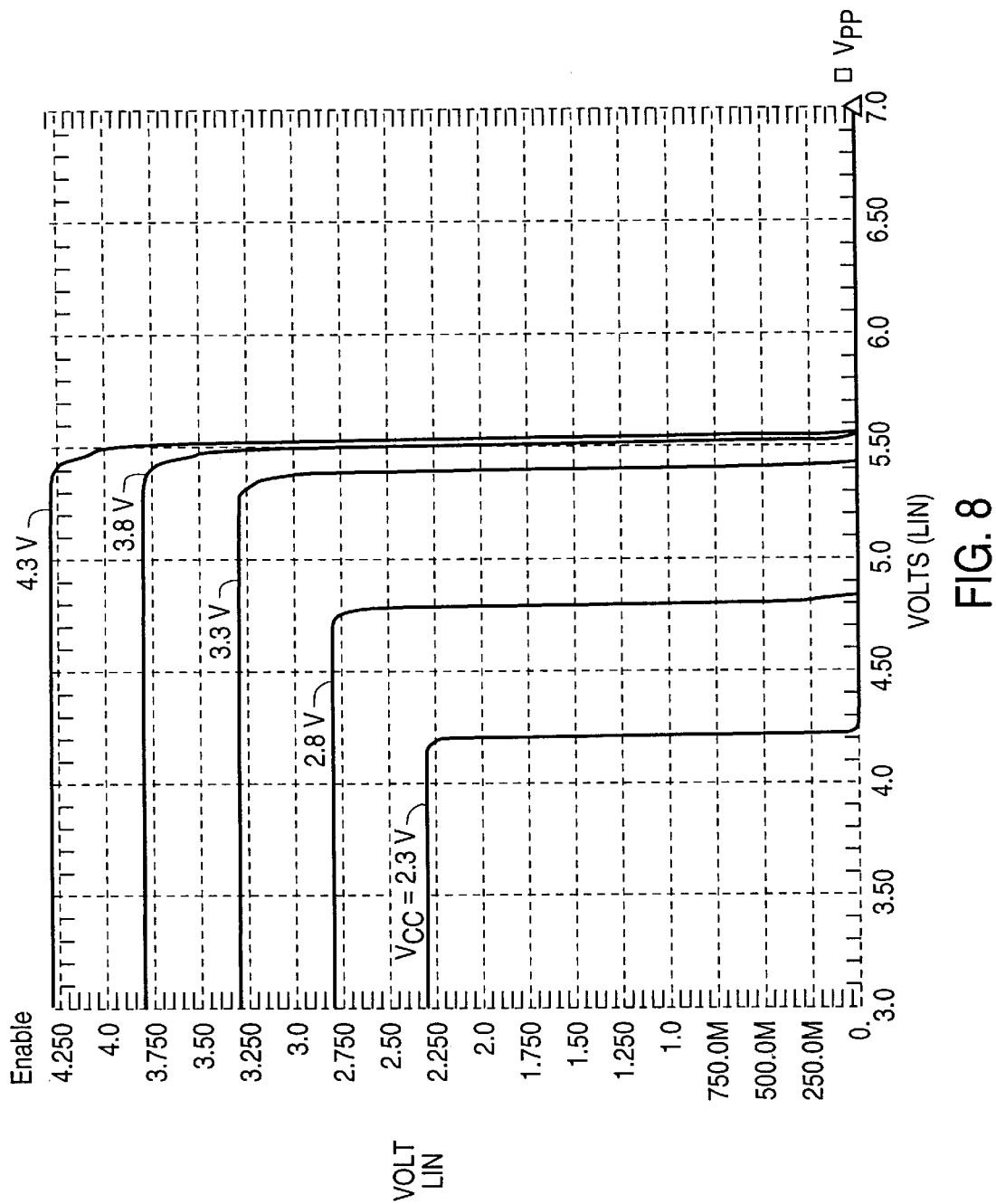
FIG. 8 is a graph showing the result of a simulation of the preferred embodiment of the present invention of FIGS. 7a and 7b.
Figure 9:
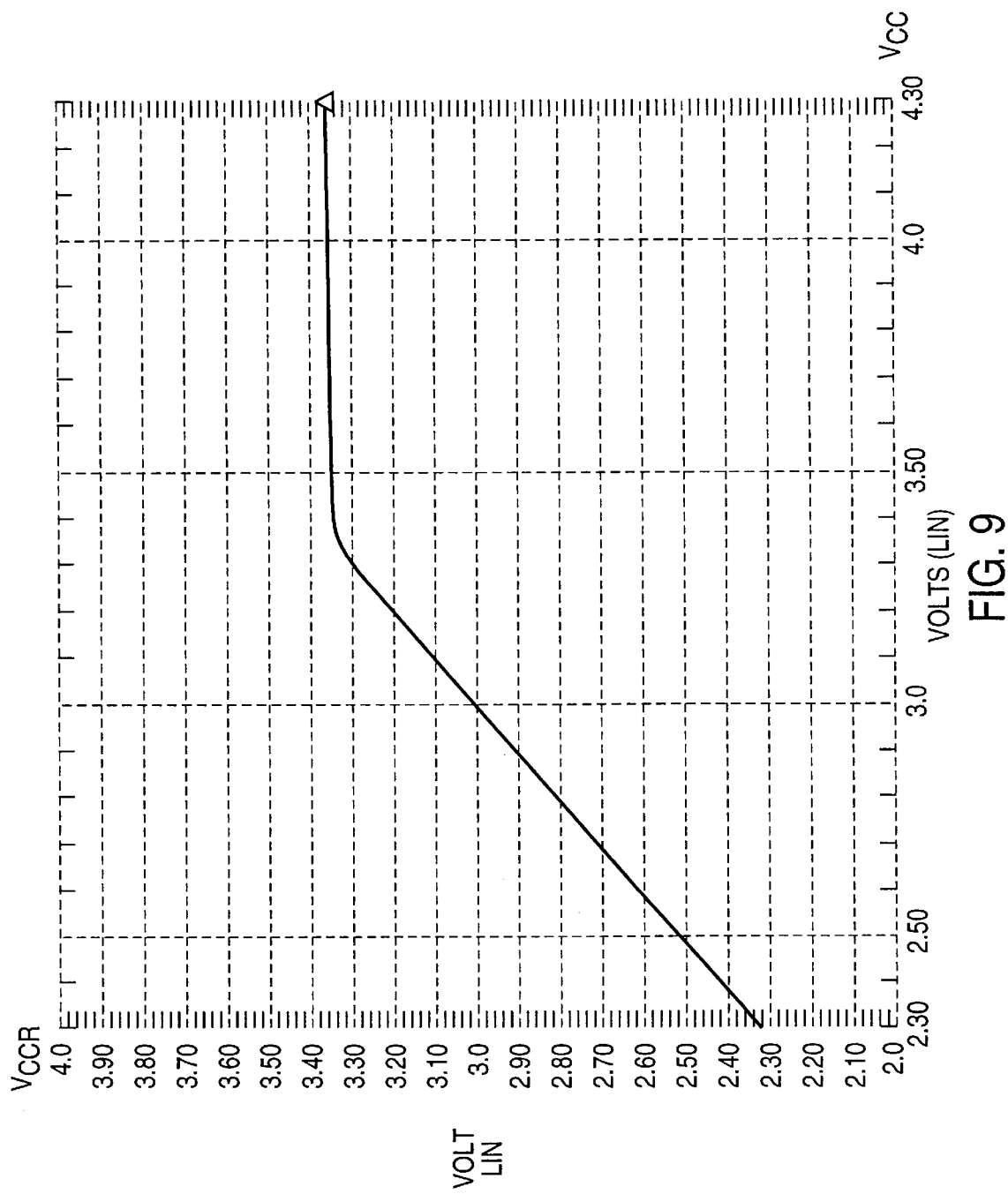
FIG. 9 is a graph showing the result of a simulation of the Vccr characteristics of the preferred embodiment of the present invention of FIGS. 7a and 7b.

FIG. 8 is the result of a simulation of the Vpp regulator circuit 500 of the present invention shown in FIG. 5. FIG. 8 shows the change of the enable signal from "high" to "low" at different supply voltages Vcc. The x-axis is Vpp and the y-axis is enable. The enable signal is shown for supply voltages Vcc of: 2.3 V, 2.8 V, 3.3 V, 3.8 V and 4.3 V. Typically, the supply voltage is 3.3 V. For supply voltages Vcc ranging from 3.8 V to 4.3 V, the enable signal starts to go low as Vpp reaches about 5.5 V. The simulation shows that for Vcc greater than approximately 3.34 V, the pumped up voltage Vpp is clamped to approximately 5.5 V, which prevents the overstress of the DRAM at higher supply voltages. FIG. 9 is the result of a simulation showing the Vccr characteristics of the Vpp regulator circuit 500 of FIGS. 7a and 7b. The result shows that when Vcc<3.34 V, Vccr is approximately equal to Vcc, and when Vcc>3.34 V, Vccr is clamped to approximately 3.34 V.

In summary, when the supply voltage is less than Vclamp, 3.34 V, the pumped up voltage Vpp is approximately clamped to Vcc+Vth(cell). Once the supply voltage Vcc exceeds Vclamp, the pumped up voltage Vpp is always clamped at Vclamp+Vth(cell), approximately, 5.5 V. Although using this voltage level on a word line can not fully restore a "one" level to the capacitor of the DRAM cell, the charge stored in the capacitor is already sufficient to ensure the proper operation. It is not necessary to use a voltage level of Vcc+Vth(cell) on the word line to get a full restoration to the capacitor.

Figure 1:
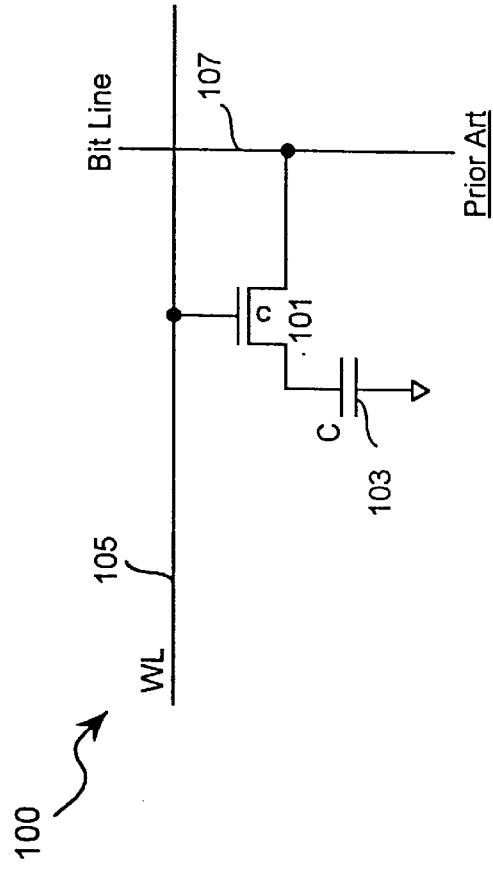
FIG. 1 is a schematic diagram of a DRAM memory cell.
Figure 2:
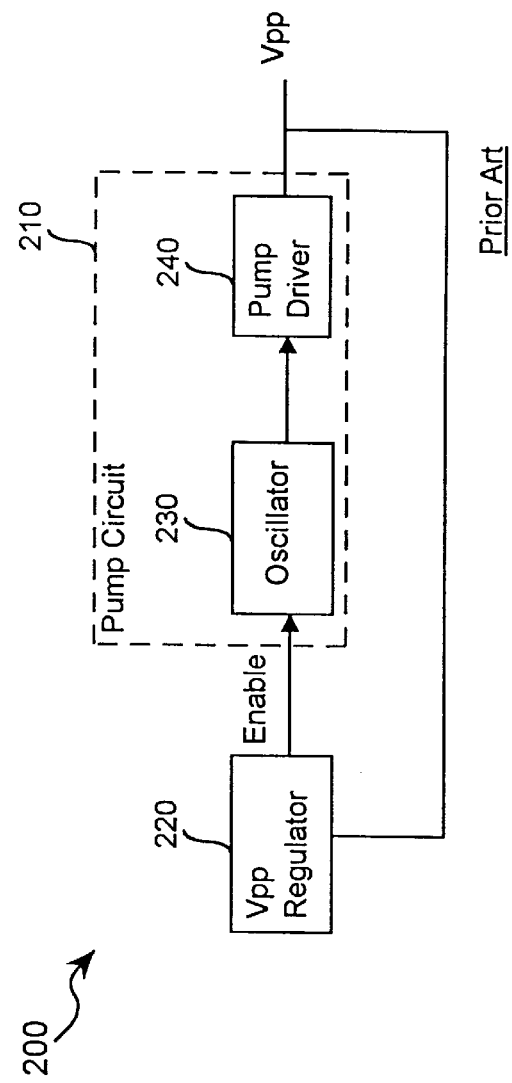
FIG. 2 is a block diagram of a Vpp generator of the prior art.
Figure 3:
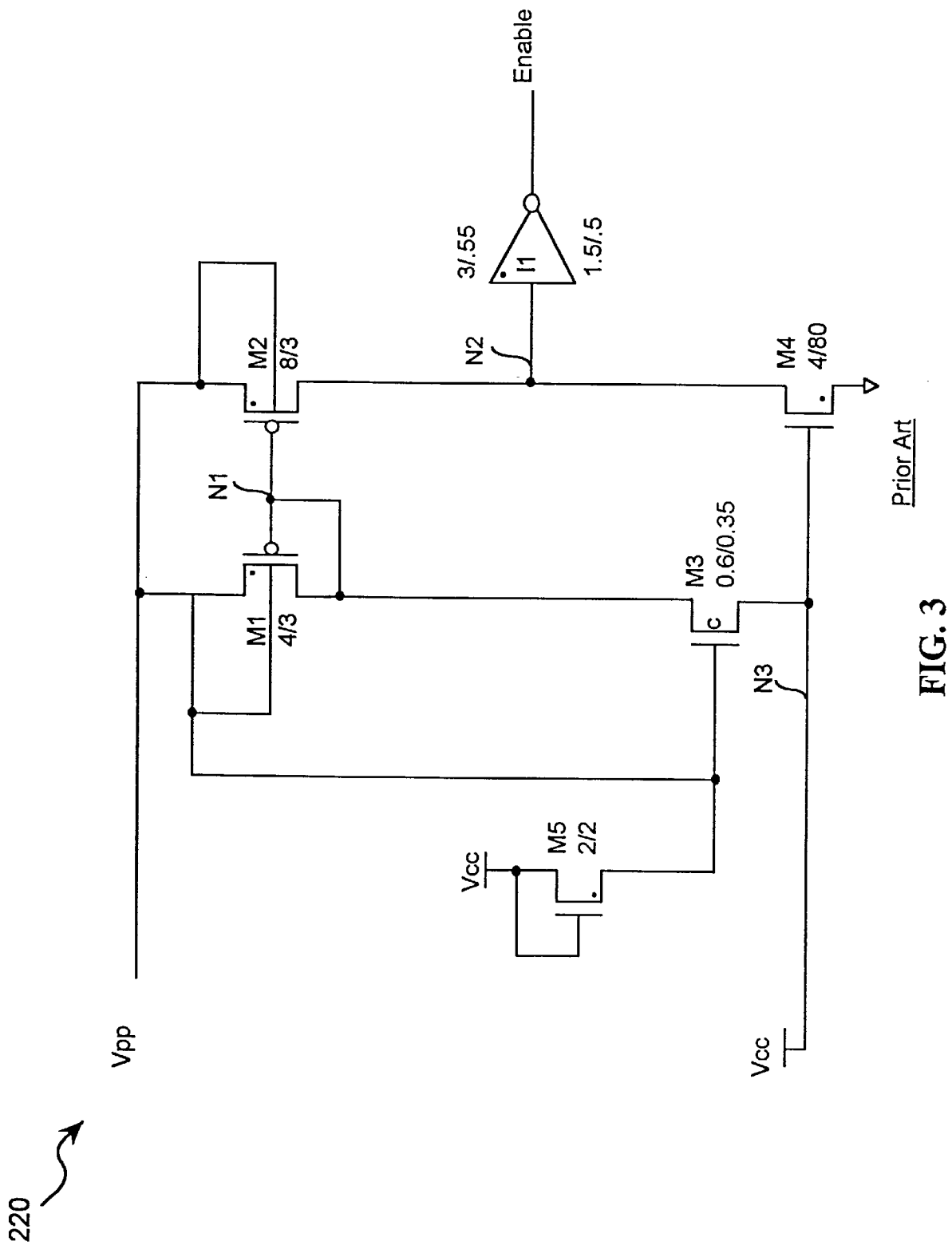
FIG. 3 is a schematic diagram of the prior art Vpp regulator of FIG. 2.
Figure 4A:
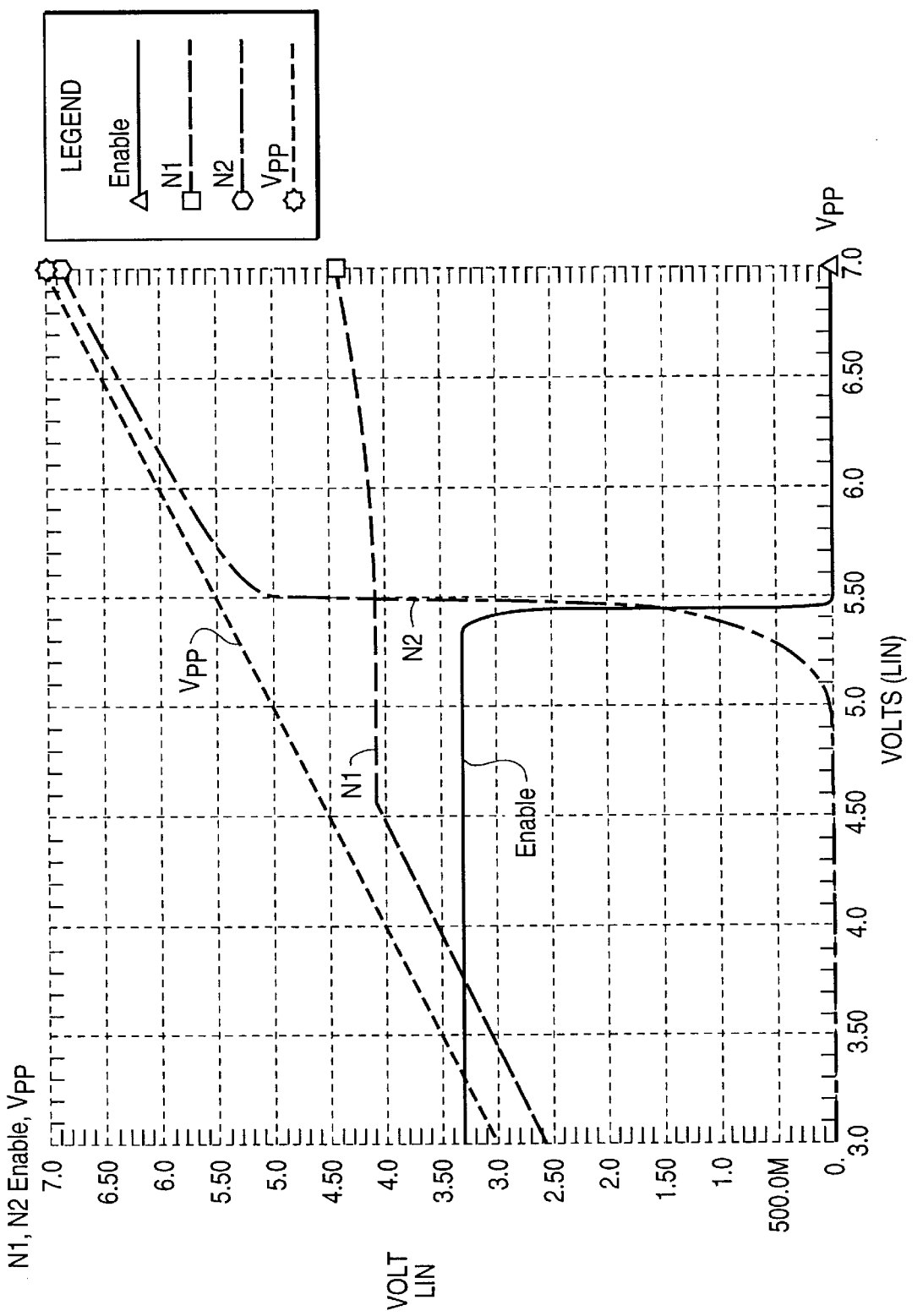
FIG. 4a is a graph showing the result of a simulation of the prior art Vpp regulator circuit of FIG. 3 when Vcc is equal to 3.3 volts.
Figure 4B:
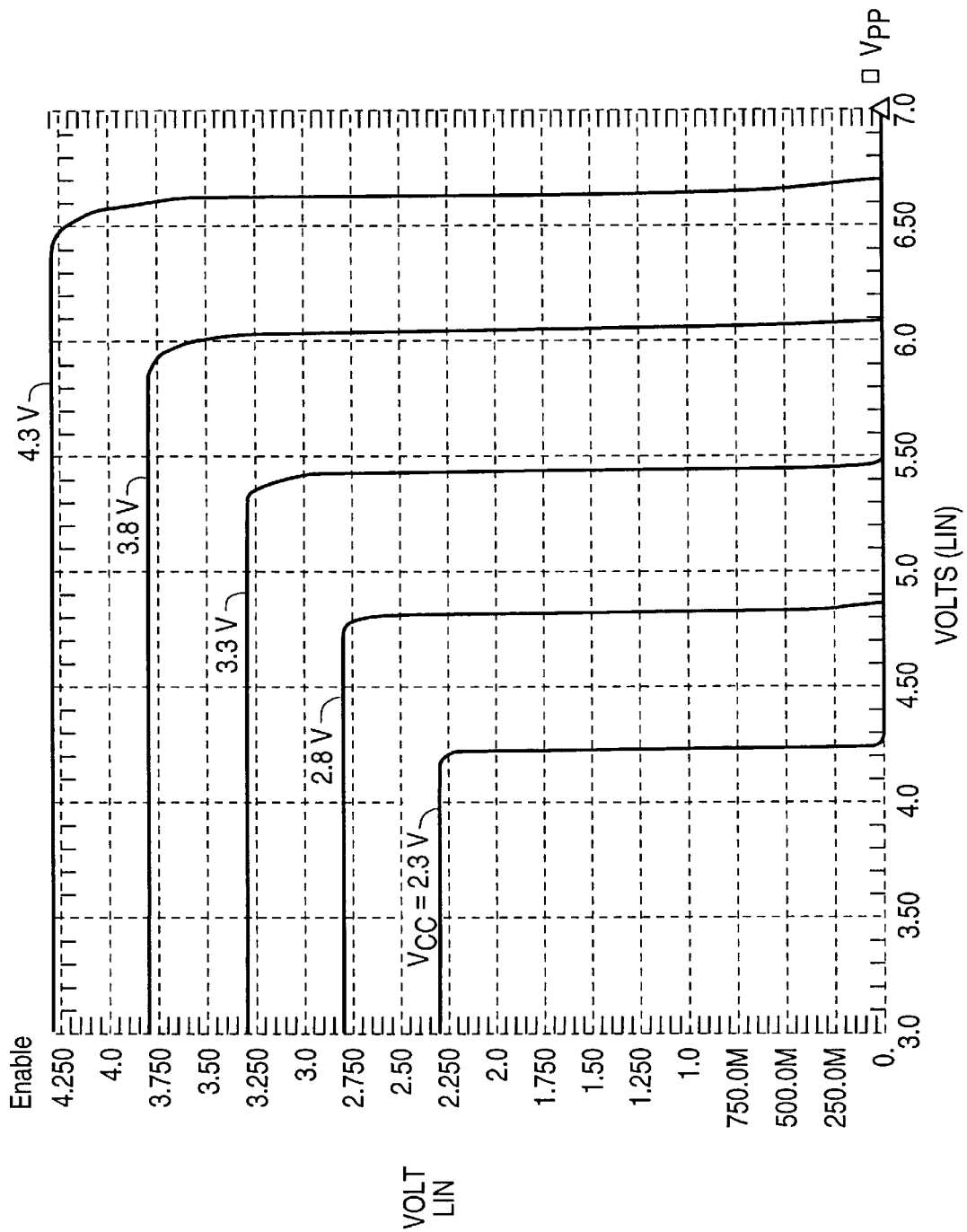
FIG. 4b is a graph of the results of a simulation of the prior art Vpp regulator circuit of FIG. 3 for various supply voltages.

Table 1 shows Vpp using the prior art circuit of FIG. 3. Vcc is the supply voltage, Qc is the charge stored in the capacitor of the DRAM cell at a "1" level, Cc is the cell capacitance, and Vcap is the voltage across the capacitor. Qc equals the voltage across the capacitor Vcap times the capacitance Cc.

TABLE 1

The Prior Art Circuit

| Vcc | Vcap | Qc | Vpp (Prior Art) |
|---|---|---|---|
| 2.6 V | 1.3 V | 1.3 V * Cc | 4.6 V |
| 2.8 V | 1.4 V | 1.4 V * Cc | 4.8 V |
| 3.3 V | 1.65 V | 1.65 V * Cc | 5.4 V |
| 3.6 V | 1.8 V | 1.8 V * Cc | 5.7 V |
| 3.8 V | 1.9 V | 1.9 * Cc | 6.0 V |
| 4 V | 2 V | 2 * Cc | 6.2 V |

Table 2 shows Vpp using the present invention.

TABLE 2

The Present Invention

| Vcc | Vcap | Qc | Vpp (Invention) |
|---|---|---|---|
| 2.6 V | 1.3 V | 1.3 V * Cc | 4.6 V |
| 2.8 V | 1.4 V | 1.4 V * Cc | 4.8 V |
| 3.3 V | 1.65 V | 1.65 V * Cc | 5.4 V |
| 3.6 V | 1.6 V | 1.6 V * Cc | 5.5 V |
| 3.8 V | 1.4 V | 1.4 * Cc | 5.5 V |
| 4 V | 1.3 V | 1.3 * Cc | 5.5 V |

As shown in Table 1, Vpp becomes very high for higher ranges of supply voltages. For example, when Vcc equals 4 V, Vpp equals 6.2 V. This may overstress the devices. In Table 2, when the supply voltage Vcc is greater than Vclamp, 3.34 V, Vpp is clamped at 5.5 V, which is safe for the devices. Even though the clamped Vpp may affect the restoration of charge to the memory cell capacitor, Table 2 shows that the charge Qc at Vcc equal to 4 V is the same as that at Vcc equal to 2.6 V.

In summary, when the supply voltage Vcc is less than Vclamp, the pumped-up voltage Vpp has a linear relationship to Vcc, approximately Vcc+Vth(cell).

When the supply voltage Vcc exceeds Vclamp, Vpp is clamped to a substantially constant level approximately equal to Vclamp plus Vth(cell). This voltage level is safe and will not overstress the devices.

Figure 10A:
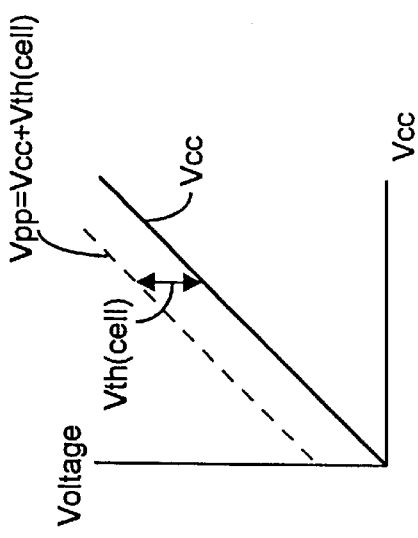
FIG. 10a is a graph showing the characteristics of the prior art Vpp regulator.
Figure 10B:
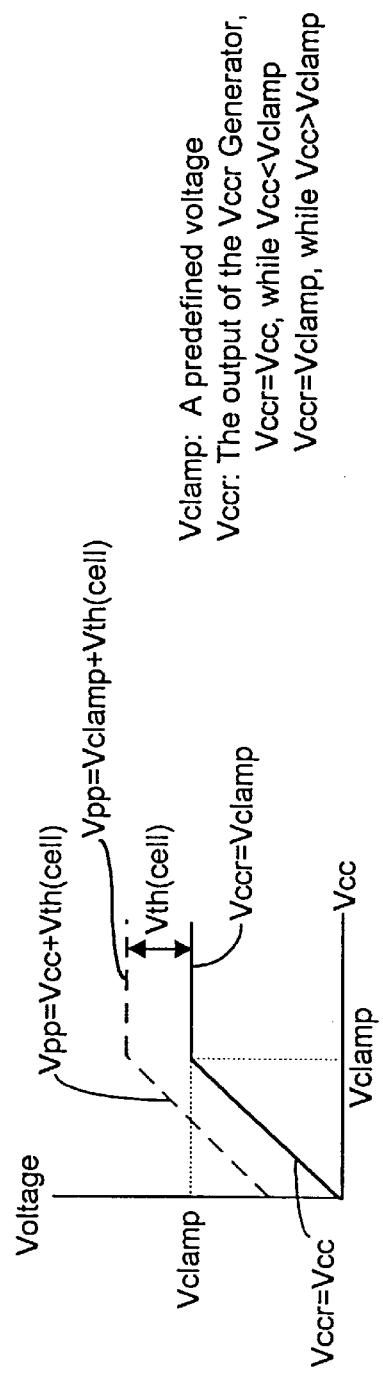
FIG. 10b is a graph showing the characteristics of the Vpp regulator of the present invention.

FIGS. 10a and 10b compare the characteristics of the prior art Vpp regulator of FIG. 3 with the Vpp regulator of the present invention of FIGS. 7a and 7b. FIG. 10a is a graph showing the characteristics of the prior art Vpp regulator. The x-axis is Vcc and the y-axis is a Voltage. The solid line shows the supply voltage, Vcc, that is input to node N3 of FIG. 3. The dashed line shows the Vpp voltage. As discussed above, in the prior art, Vpp=Vcc+Vth(cell). FIG. 10b is a graph showing the characteristics of the Vpp regulator of the present invention. The solid line shows the voltage that is input to node N3 of FIGS. 7a and 7b. The dashed line shows the Vpp voltage. The voltage at node N3 is clamped to a level, called Vclamp, when the supply voltage exceeds Vclamp, thereby clamping Vpp to a maximum predetermined value substantially equal to Vclamp+Vth(cell).

Figure 11:
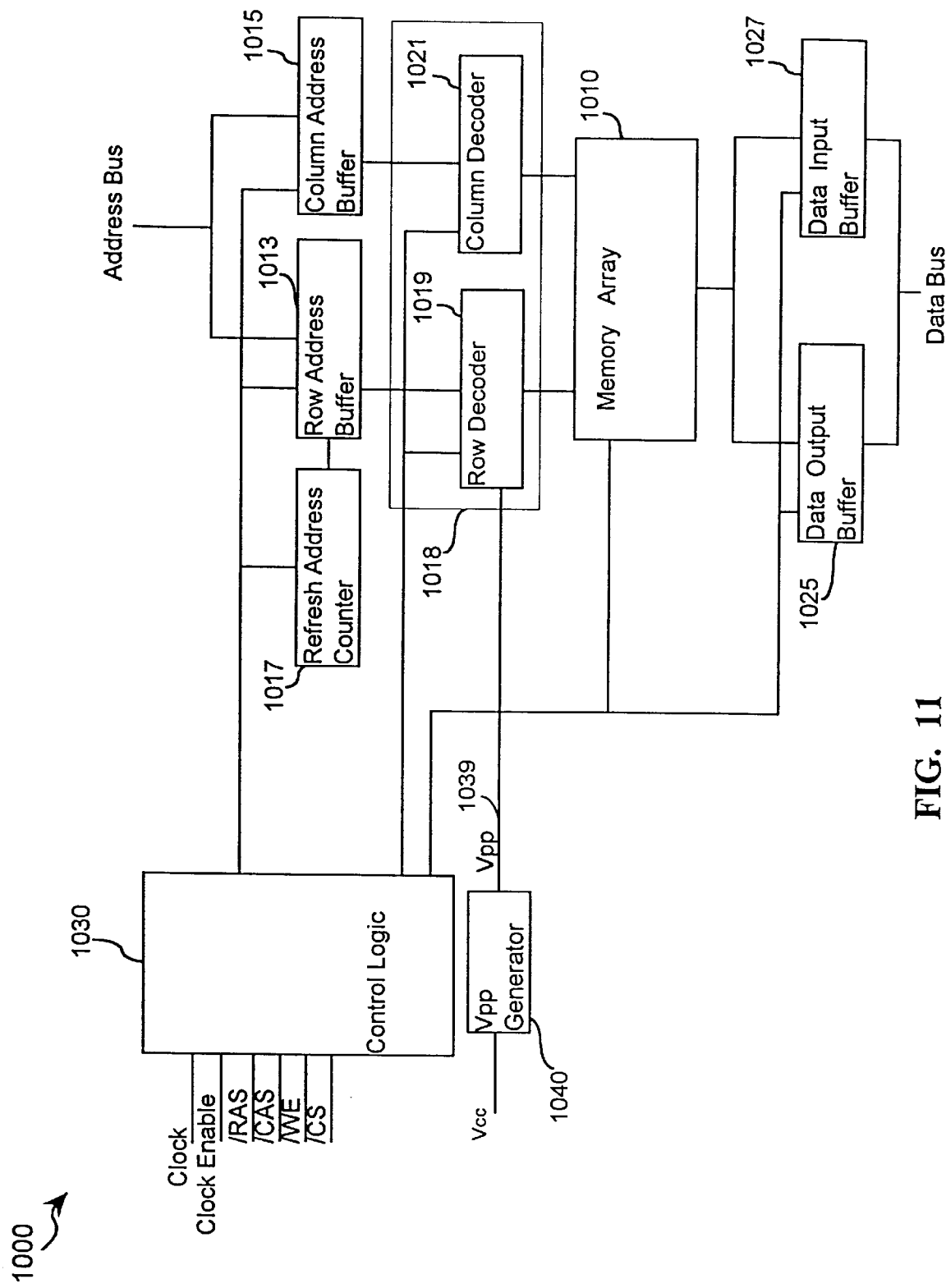
FIG. 11 is a block diagram of a DRAM suitable for use with the pre sent invention.

FIG. 11 is a block diagram of a DRAM suitable for use with the voltage regulator of the present invention. The DRAM 1000 connects to an address bus, data bus and external control signals. The DRAM 1000 comprises many well-known parts.

A memory array 1010 has a plurality of memory cells organized into rows and columns. A row is selectable by the word line and a column is selectable by the bit line.

A row address buffer 1013 stores a row address supplied on the address bus.

A column address buffer 1015 stores a column address supplied on the address bus.

A refresh address counter 1017 provides the current address to refresh.

A decoder 1018 comprises a row decoder 1019 and a column decoder 1021. The row decoder 1019 connects to the row address buffer 1013 and memory array 1010, and comprises logic to translate the row address supplied to the row address buffer 1013 to select the desired row or word line of the memory array 1010. The column decoder 1021 connects to the column address buffer 1015 and memory array 1010, and comprises logic to translate the column address supplied to the column address buffer 1015 to select the desired column or bit line(s) of the memory array 1010.

A data output buffer 1025 stores information read from the memory array 1010 for output to the data bus.

A data input buffer 1027 stores information received from the data bus for input to the memory array 1010.

Control Logic 1030 connects to the external control signals, including the clock, and to the elements listed above to control the operation of the DRAM. A "/" in front of the signal name indicates that the signal is active with negative logic. Typical external control signals are shown: a clock input, a clock enable input, a row address select (/RAS) input, a column address select (/CAS) input, a write enable (/WE) input and a chip select (/CS) signal.

In the DRAM 1000, the Vpp generator 1040 of the present invention connects to Vcc and outputs a pumped up voltage Vpp 1039 to the row decoder 1019 for input to the memory array 1010.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A Vpp voltage generator for use in a dynamic random access memory integrated circuit, comprising:
   a pump circuit for generating a pumped up voltage; and
   a voltage regulator for controlling the pump circuit such that the pumped up voltage has a maximum predetermined value for a predefined range of voltages for a supply voltage;
   wherein said maximum predetermined value is substantially equal to a predetermined clamp voltage plus a predetermined differential if the supply voltage exceeds a threshold clamp voltage.

2. The Vpp voltage generator of claim 1 wherein the voltage regulator further comprises:
   a clamp voltage generator for generating the predetermined clamp voltage.

3. The Vpp voltage generator of claim 1 wherein the voltage regulator further comprises:
   a reference voltage generator for generating a reference voltage; and
   a voltage multiplier for multiplying the reference voltage by a predetermined factor to generate a clamp voltage;
   wherein the maximum predetermined value of the pumped up voltage is substantially equal to the clamp voltage plus a predefined differential.

4. The Vpp voltage generator of claim 1 wherein the predefined differential is substantially equal to a memory cell threshold voltage.

5. A Vpp generator, comprising:
   a Vpp regulator for regulating a Vpp voltage such that the Vpp regulator outputs a regulated voltage substantially equal to a predetermined clamp voltage plus a determined differential if a supply voltage exceeds a threshold clamp voltage; and
   a pump circuit for generating a pumped up voltage such that the pumped up voltage is substantially equal to the regulated voltage.

6. The Vpp generator of claim 5, wherein the Vpp regulator further comprises:
   a reference voltage generator for generating a reference voltage, and
   a voltage multiplier for multiplying the reference voltage by a predetermined factor to generate the predetermined clamp voltage.

7. The Vpp generator of claim 5 wherein the predetermined clamp voltage is substantially equal to the supply voltage if the supply voltage is less than the threshold clamp voltage.

8. The Vpp generator of claim 5 wherein the pump circuit comprises an oscillator and a pump driver coupled to the oscillator, and
   the Vpp regulator further comprises an oscillator controller for outputting an off signal for turning off the oscillator when the pumped up voltage exceeds the regulated voltage.

9. The Vpp generator of claim 5 wherein the Vpp regulator further comprises a memory cell access transistor, and the predefined differential is substantially equal to a threshold voltage of the memory cell access transistor.

10. A Vpp generator, comprising:
    a pump circuit for generating a pumped up voltage;
    a Vpp regulator for regulating the pumped up voltage having a clamp voltage generator for generating a first clamp voltage, and an interface circuit,
    the clamp voltage generator for generating a first clamp voltage having a first maximum predetermined value such that the first clamp voltage is substantially equal to a supply voltage when the supply voltage is less than the first maximum predetermined value, and the first clamp voltage is substantially equal to the first maximum predetermined value when the supply voltage exceeds the first maximum predetermined value, and
    the interface circuit for outputting an on signal to the pump circuit to increase the pumped up voltage when the pumped up voltage is less than a second clamp voltage, and outputting an off signal to the pump circuit to stop the increase of the pumped up voltage when the pumped up voltage exceeds the second clamp voltage, wherein the second clamp voltage is substantially equal to the first clamp voltage plus a predefined differential.

11. A DRAM comprising:
- a plurality of memory cells coupled to a plurality of word lines; and
- a pumped-up voltage generator for generating a pumped-up voltage to be applied to a selected word line of the plurality of word lines, the pumped-up voltage generator clamping the pumped-up voltage to a predetermined level for a predefined range of voltages for a supply voltage;
- wherein said pumped-up voltage is substantially equal to a predetermined clamp voltage plus a predetermined differential if the supply voltage exceeds a threshold clamp voltage.

12. The DRAM of claim 11 wherein the pumped-up voltage generator further comprises:
- a pump circuit for generating the pumped-up voltage; and
- a voltage regulator for controlling the pump circuit such that the pumped-up voltage is clamped to a maximum predetermined value for a predefined range of supply voltages.

13. A method for generating a pumped up voltage in a dynamic random access memory integrated circuit, comprising:
- generating a regulated voltage;
- generating a pumped up voltage;
- clamping the pumped up voltage to a predetermined level substantially equal to the regulated voltage plus a predefined differential for a range of voltages for a supply voltage;
- wherein the pumped up voltage is clamped to the predetermined level when the supply voltage exceeds the regulated voltage.

14. The method of claim 13 further comprising the steps of:
- generating a reference voltage;
- generating the regulated voltage by multiplying the reference voltage by a predetermined multiplication factor.

* * * * *